United States Patent [19]
Kanayama et al.

[11] Patent Number: 5,565,777
[45] Date of Patent: Oct. 15, 1996

[54] METHOD/APPARATUS FOR NMR IMAGING USING AN IMAGING SCHEME SENSITIVE TO INHOMOGENEITY AND A SCHEME INSENSITIVE TO INHOMOGENEITY IN A SINGLE IMAGING STEP

[75] Inventors: Shoichi Kanayama, Saitama-ken; Shigehide Kuhara, Kanagawa-ken, both of Japan

[73] Assignee: Kabushiki Kaisha Toshiba, Kawasaki, Japan

[21] Appl. No.: 305,453

[22] Filed: Sep. 13, 1994

[30] Foreign Application Priority Data

Sep. 13, 1993 [JP] Japan .................................. 5-227529

[51] Int. Cl.$^6$ ............................. G01V 3/02; A61B 5/055; A61B 5/0265
[52] U.S. Cl. ...................... 324/309; 128/653.2; 128/632
[58] Field of Search .................................. 324/306, 307, 324/309, 300; 128/653.2, 653.3, 632

[56] References Cited

U.S. PATENT DOCUMENTS

| | | | |
|---|---|---|---|
| 4,689,567 | 8/1987 | Maudsley | 324/309 |
| 5,204,625 | 4/1993 | Cline et al. | 324/306 |
| 5,270,651 | 12/1993 | Wehrli | 128/653.2 X |
| 5,320,099 | 6/1994 | Roberts et al. | 324/306 |
| 5,329,925 | 7/1994 | NessAiver | 128/653.2 |
| 5,394,872 | 3/1995 | Takiguchi et al. | 324/306 X |

*Primary Examiner*—Sandra L. O'Shea
*Assistant Examiner*—Roger Phillips
*Attorney, Agent, or Firm*—Oblon, Spivak, McClelland, Maier & Neustadt, P.C.

[57] ABSTRACT

A nuclear magnetic resonance imaging scheme for imaging living body information related to the physiological function change in the living body. In this scheme, the pulse sequence realizes a first imaging scheme sensitive to functional information of the body to be examined and a second imaging scheme insensitive to the functional information of the body to be examined so as to obtain first and second types of the nuclear magnetic resonance images corresponding to the first and second imaging schemes, respectively, by a single execution of this pulse sequence. The functional information of the body to be examined is then obtained by processing the first and second types of the nuclear magnetic resonance images.

34 Claims, 16 Drawing Sheets

METHOD/APPARATUS FOR NMR IMAGING USING AN IMAGING SCHEME SENSITIVE TO INHOMOGENEITY AND A SCHEME INSENSITIVE TO INHOMOGENEITY IN A SINGLE IMAGING STEP

BACKGROUND OF THE INVENTION

1. Field of the Invention

The present invention relates to a nuclear magnetic resonance imaging, and more particularly, to a nuclear magnetic resonance imaging suitable for imaging physiological function information of the interior of the body to be examined at high precision.

2. Description of the Background Art

In recent years, many medical diagnostic systems using the nuclear magnetic resonance imaging (MRI) apparatus have been developed.

As well known, the nuclear magnetic resonance imaging is a method for imaging microscopic chemical and physical information of matters by utilizing the nuclear magnetic resonance phenomenon in which the energy of a radio frequency magnetic field rotating at a specific frequency can be resonantly absorbed by a group of nuclear spins having unique magnetic moments which are placed in a homogeneous static magnetic field.

In this nuclear magnetic resonance imaging, the images can be obtained in various contrasts such as the image in contrast emphasizing the longitudinal relaxation time $T_1$ of the nuclear spins ($T_1$ image), the image in contrast emphasizing the transverse relaxation time $T_2$ of the nuclear spins ($T_2$ image), the image in contrast emphasizing the density distribution of the nuclear spins (density image), and the image in contrast emphasizing the parameter $T_2^*$ which reflects both the transverse relaxation time $T_2$ and the sudden phase change of the nuclear spins due to the microscopic magnetic field inhomogeneity within a voxel.

On the other hand, as described in S. Ogawa et al.: "Oxygenation-Sensitive Contrast in Magnetic Resonance Image of Rodent Brain at High Magnetic Fields", Magnetic Resonance in Medicine 14, pp. 68–78, 1990, it is known that, among the hemoglobin contained in blood of the living body, the oxyhemoglobin contained in abundance in the arterial blood is diamagnetic, while the deoxyhemoglobin mainly contained in the venous blood is paramagnetic. Then, as described in R. M. Weisskoff et al.: "MRI Susceptometry: Image-Based Measurement of Absolute Susceptibility of MR contrast Agents and Human Blood", Magnetic Resonance in Medicine 24, pp. 375–383, 1992, it is also known that the diamagnetic oxyhemoglobin does not disturb the local magnetic field very much (magnetic susceptibility difference of 0.02 ppm with respect to the living body tissues), but the paramagnetic deoxyhemoglobin has sufficiently large magnetic susceptibility difference with respect to the surrounding tissues (magnetic susceptibility difference of 0.15 ppm with respect to the living body tissues) to disturb the magnetic field so that the parameter $T_2^*$ is going to be shortened.

Also, as described in J. A. Detre, et al.: "Perfusion Imaging", Magnetic Resonance in Medicine 23, pp. 37–45, 1992, in some imaging schemes of the nuclear magnetic resonance imaging, when the amount or the speed of the local blood flow within the living body tissues, the relaxation time (such as $T_1$) of the living body seemingly appears to have changed, and the image contrast can be changed.

By utilizing the above noted properties, it is possible to image the change of the blood flow or the change of the oxygen density in blood due to the physiological function such as the cell activity within the living body tissues including the activation of the visual area in the brain cortex caused by the light stimulation, as described for example in K. K. Kwong et al.: "Dynamic magnetic resonance imaging of human brain activity during primary sensory stimulation", Proc. Natl. Acad. Sci. USA, Vol. 89. pp. 5675–5679, June 1992. Conventionally, the imaging scheme used in this type of imaging has been the echo planar scheme using the pulse sequence as shown in FIG. 1 or the gradient echo scheme using the pulse sequence as shown in FIG. 2.

However, in these imaging schemes, the signal change (image contrast change) caused by the physiological function within the living body is quite minute. For this reason, conventionally, this minute signal change has been detected by calculating the difference or the correlation of the images before and after the occurrence of the physiological function phenomenon, as described in R. T. Constable, et al.: "Functional Brain Imagings at 1.5 T using Conventional Gradient Echo MR Imaging Techniques", Magnetic Resonance Imaging, Vol. 11, pp. 451–459, 1993. In addition, there has been an attempt to comprehend the physiological function quantitatively by calculating the change of the blood flow amount or the oxygen density in blood from the change of the contrast intensity or the phase in the images.

However, in such a conventional method, when the position displacement due to the body movement between two images occurs, it becomes impossible to detect such a minute change accurately. In fact, it is well known that the position and the size of the brain can change in synchronization with the heart beat, as described in B. P. Poncelet, et al.: "Brain Parenchyma Motion: Measurement with Cine Echo-Planar MR imaging", Radiology, Vol. 185, pp. 645–651, December 1992. Thus, in the conventional method, because of the influence of the body movement due to the breathing or the heart beat, it has been impossible to accurately detect the signal change (image contrast change) caused by the physiological function such as the cell activity in the living body.

On the other hand, it is also well known that the image distortion can be caused in the nuclear magnetic resonance imaging when the static magnetic field distribution is inhomogeneous, and this image distortion becomes particularly noticeable in the imaging scheme for the $T_2^*$ image which is used in detecting the physiological function phenomenon such as the cell activity in the living body. However, when such an image distortion is present, it is impossible to accurately detect the position of the physiological function change such as the cell activity in the living body.

Moreover, in a case of calculating an average image from a plurality of images obtained by the repeated imaging operations in order to improve the signal to noise ratio of the image, or carrying out the processing among a plurality of images in order to detect the physiological function phenomenon such as the cell activity in the living body, when the signal strength or the imaged portion changes depending on the imaging conditions or the system states, it is impossible to accurately detect the physiological function change such as the cell activity in the living body by the processing among the images.

SUMMARY OF THE INVENTION

It is therefore an object of the present invention to provide a method and an apparatus for nuclear magnetic resonance imaging, capable of imaging living body information such as the blood flow change or the oxygen density in blood related to the physiological function change in the living body.

According to one aspect of the present invention there is provided a method of nuclear magnetic resonance imaging, comprising the steps of: imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images; controlling the pulse sequence to realize a first imaging scheme sensitive to functional information of the body to be examined and a second imaging scheme insensitive to the functional information of the body to be examined so as to obtain first and second types of the nuclear magnetic resonance images corresponding to the first and second imaging schemes, respectively, by a single execution of the imaging step; and obtaining the functional information of the body to be examined by processing the first and second types of the nuclear magnetic resonance images.

According to another aspect of the present invention there is provided an apparatus for nuclear magnetic resonance imaging, comprising: imaging means for imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images; control means for controlling the pulse sequence to realize a first imaging scheme sensitive to functional information of the body to be examined and a second imaging scheme insensitive to the functional information of the body to be examined so as to obtain first and second types of the nuclear magnetic resonance images corresponding to the first and second imaging schemes, respectively, by a single execution of the pulse sequence; and processing means for obtaining the functional information of the body to be examined by processing the first and second types of the nuclear magnetic resonance images.

Other features and advantages of the present invention will become apparent from the following description taken in conjunction with the accompanying drawings.

DETAILED DESCRIPTION OF THE PREFERRED EMBODIMENTS

Now, the various embodiments of a method and an apparatus for nuclear magnetic resonance imaging according to the present invention will be described in detail.

Figure 1:
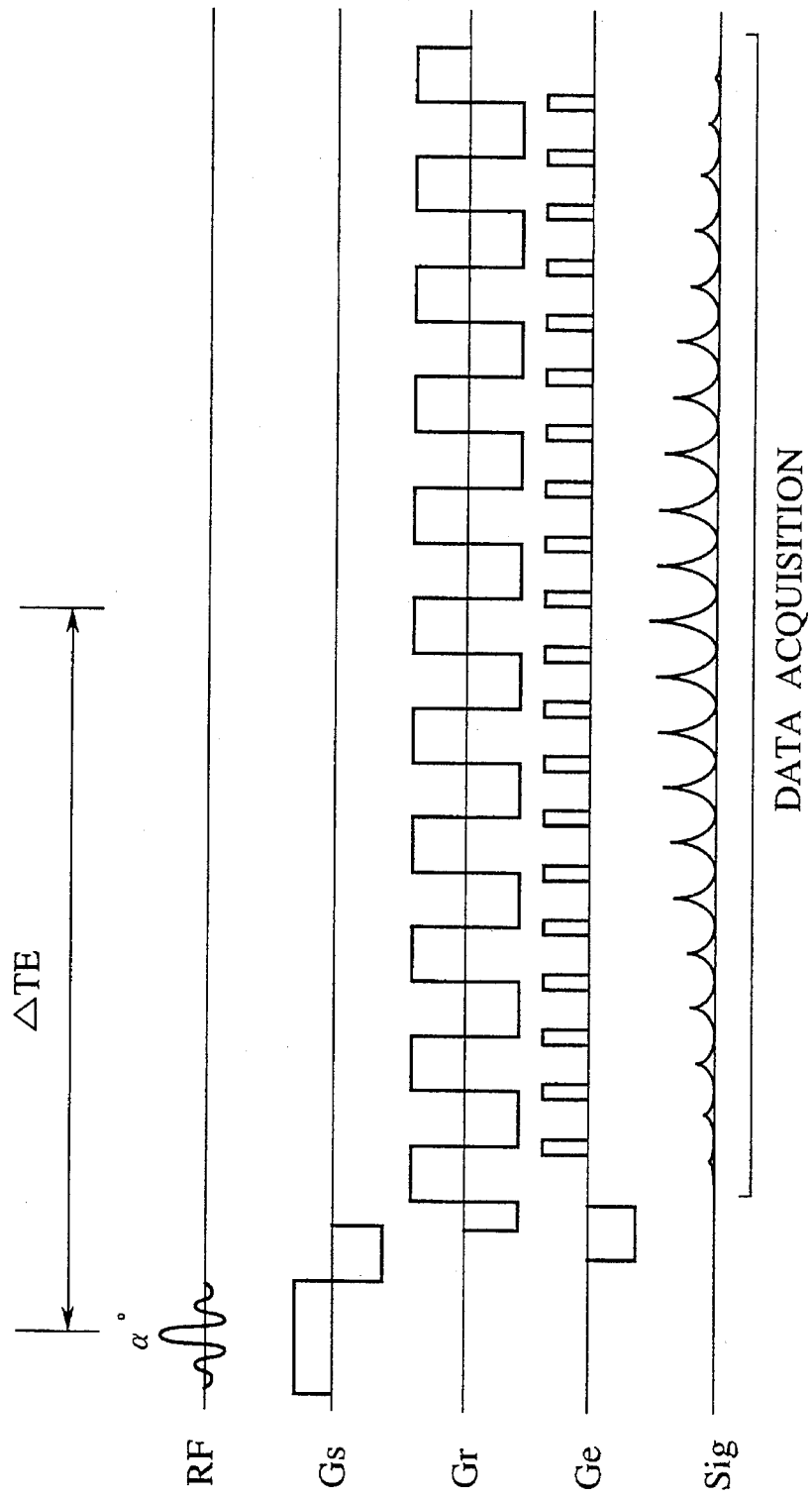
FIG. 1 is a diagram of a pulse sequence for the conventional echo planar scheme.
Figure 2:
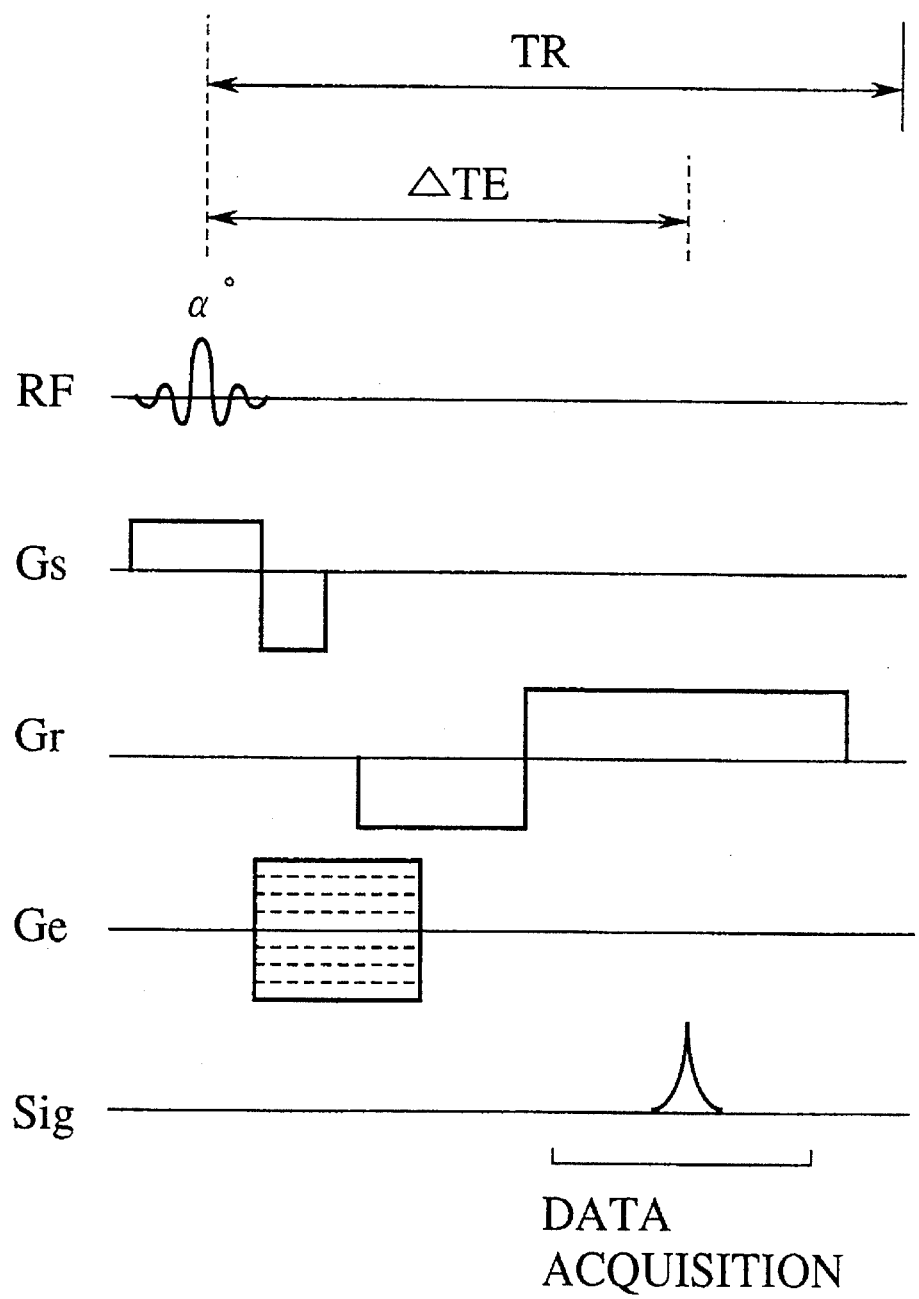
FIG. 2 is a diagram of a pulse sequence for the conventional gradient echo scheme.
Figure 3:
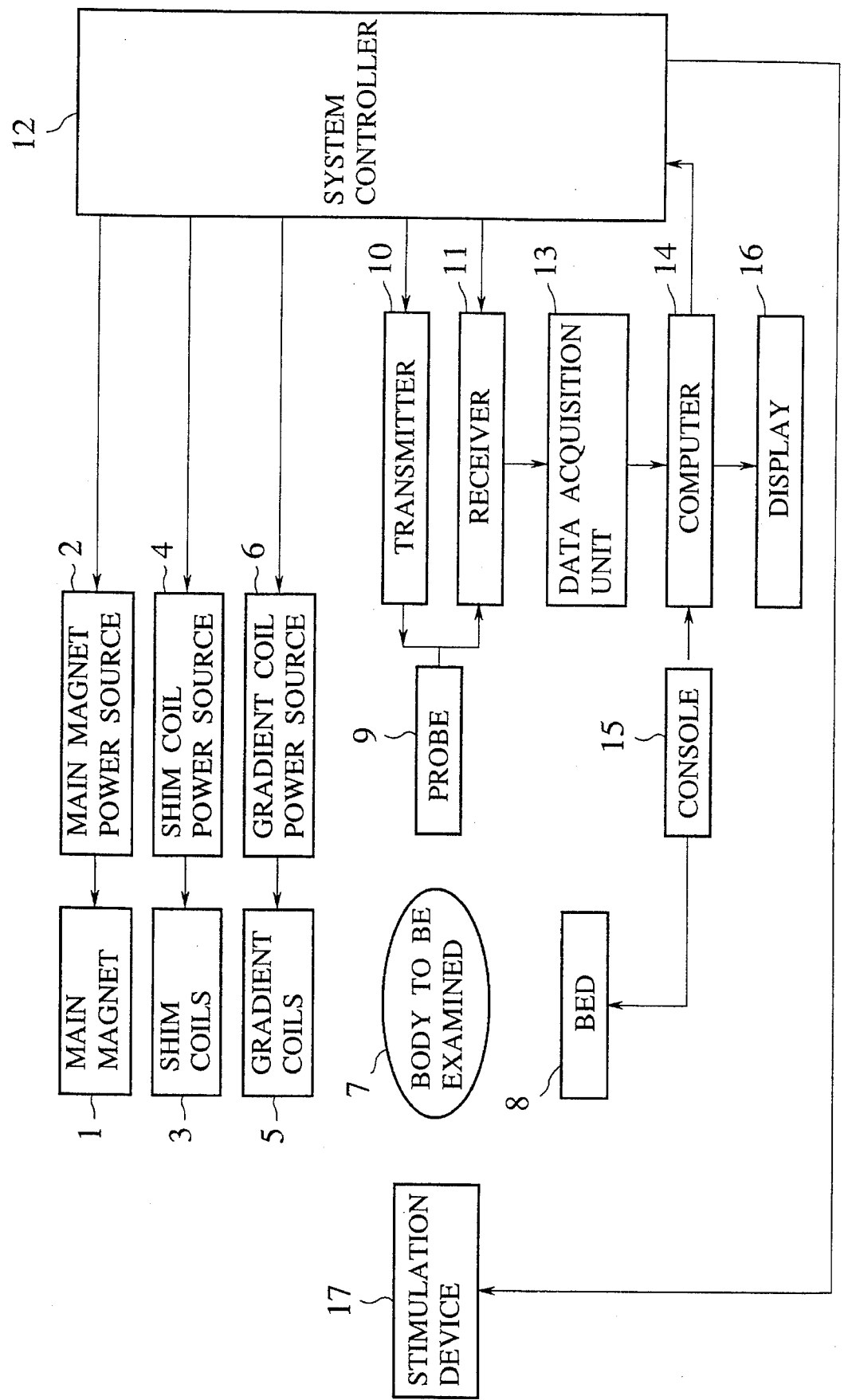
FIG. 3 is a block diagram of a nuclear magnetic resonance imaging apparatus suitable for the present invention.

First, the MRI apparatus suitable for the present invention has a configuration as shown in FIG. 3, which includes a main magnet 1 for generating the static magnetic field, shim coils 8 for adjusting the homogeneity of the static magnetic field, and gradient coils 5 for generating gradient magnetic fields, which are driven by a main magnet power source 2, a shim coil power source 4, and a gradient coil power source 6, respectively, such that the homogeneous static magnetic field and the gradient magnetic fields having linear gradient field distribution in three orthogonal directions can be applied onto a body to be examined 7.

In addition, there is provided a probe 9 to which radio frequency signals are transmitted from a transmitter 10 such that radio frequency magnetic fields can be applied from this probe 9 to the body to be examined 7. This probe 9 is also used for receiving the nuclear magnetic resonance signals emitted from the body to be examined 7 in response to the application of these magnetic fields, but a separate signal detector may be provided in addition to this probe 9 if desired.

The nuclear magnetic resonance signals received by the probe 9 are detected by the quadrature detection at a receiver 11, and A/D converted at data acquisition unit 13, and then supplied to a computer 14.

Here, the operations of the main magnet power source 2, the shim coil power source 4, the gradient coil power source 6, the transmitter 10, the receiver 11, and the data acquisition unit 13 are controlled by a system controller 12, which in turn is controlled from a console 15 through the computer 14.

At the computer 14, the image reconstruction processing is carried out according to the nuclear magnetic resonance signal data supplied from the data acquisition unit 13, so as to obtain the image data. The obtained images are then displayed on a display 16. This computer 14 as well as a bed 8 for mounting the body to be examined 7 thereon are controlled from the console 15.

Figure 8:
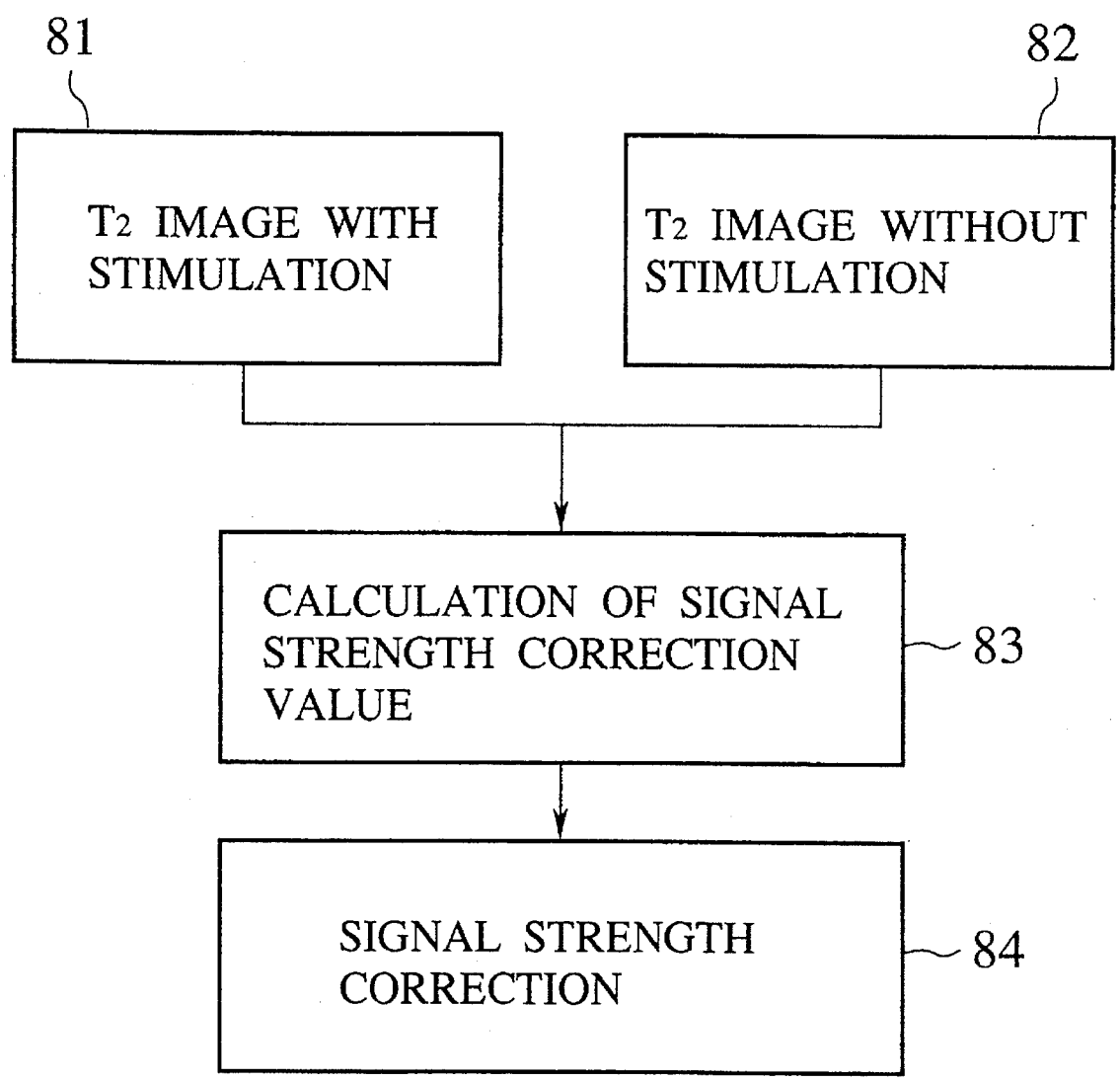
FIG. 8 is a flow chart for the signal strength correction processing used in the operation of FIG. 5.

In this configuration of FIG. 8, the pulse sequence for acquiring the image data within slice planes in the body to be examined 7 as well as a stimulation device 17 for providing a stimulation such as lights or sounds to the body to be examined 7 are controlled by the system controller 12.

In the following, the imaging schemes for imaging the physiological function information of the interior of the body to be examined by using the MRI apparatus of FIG. 3 will be described. Here, the exemplary case of using the parameter $T_2^*$ as a functional information and the parameter $T_2$ as a shape information will be explained as an illustrative example.

Figure 4:
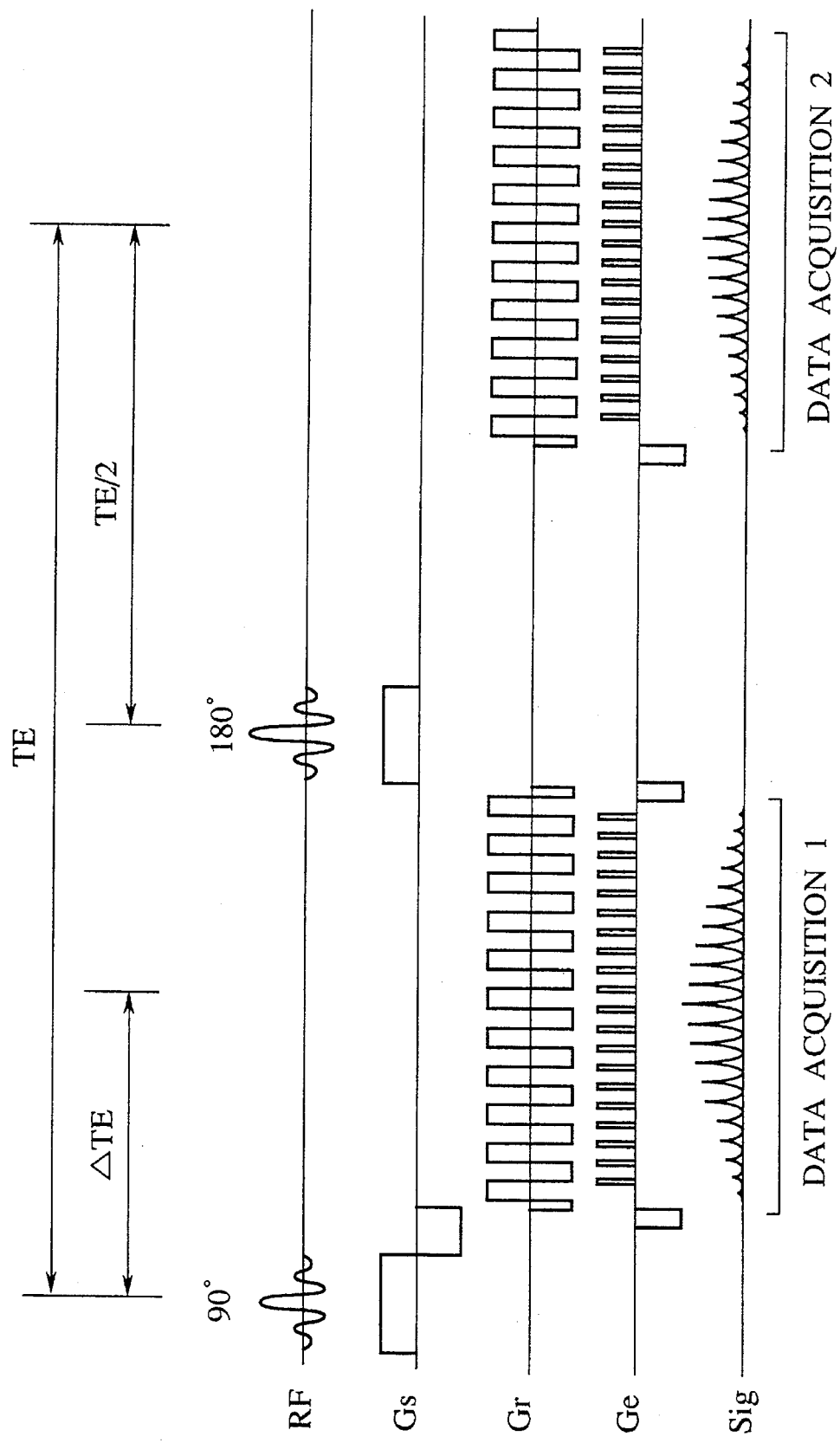
FIG. 4 is a diagram of a pulse sequence for the first embodiment of the imaging scheme for imaging the physiological function information according to the present invention.

Now, FIG. 4 shows the pulse sequence of the first embodiment of the imaging scheme for imaging the physiological function information in the body to be examined. In this FIG. 4, RF indicates the radio frequency magnetic fields (RF pulses), while Cs, Gr, and Ge indicate the slicing, reading, and phase encoding gradient magnetic Fields, respectively, and Sig indicates the nuclear magnetic resonance signals (NMR signals). Here, the slicing gradient magnetic field Gs is provided for exciting a desired slice region in the body to be examined 7, the reading gradient magnetic field Gr is for provided for reading out the nuclear magnetic resonance signals, and the phase encoding gradient magnetic field Ge is provided for encoding position information into phases of the nuclear magnetic resonance signals.

In this first embodiment, the 90° RF pulse and the slicing gradient magnetic field Gs are applied to excite the desired slice region to generate the free induction decay (FID) NMR signals first. Then, the first data acquisition is carried out by the echo planar scheme in which the reading gradient magnetic field Gr is repeatedly switched to positive and negative alternately to generate a plurality of echo signals, while the phase encoding gradient magnetic field Ge is applied at a timing of each echo signal. Then, the 180° RF pulse is applied to generate the spin echo signals, and the second data acquisition is carried out by the similar echo planar scheme.

Then, after the appropriate preliminary processing, the data obtained by the first and second data acquisitions are complex Fourier transformed to produce two images. At this point, the time intervals from the center of the 90° RF pulse to the data at an origin of two dimensionally arranged data for the first and second data acquisitions are denoted as ATE and TE, respectively. In these two images, the image obtained from the first data acquisition is going to be the $T_2^*$ image reflecting the transverse relaxation time $T_2$ of the nuclear spins and the microscopic magnetic field inhomogeneity within a voxel, while the image obtained from the second data acquisition is going to be the $T_2$ image reflecting the transverse relaxation time $T_2$ of the nuclear spins. The actual time intervals ΔTE and TE for imaging the head portion are typically 40 to 60 msec for ΔTE, and 100 to 120 msec for TE.

Here, in the first half of the imaging sequence of FIG. 4, the NMR signals are detected in a state in which the phases of the nuclear spins are disturbed by the microscopic magnetic field inhomogeneity, so that the $T_2^*$ image obtained by the first data acquisition is the image which is easily affected by the microscopic magnetic field inhomogeneity and therefore it can serve as the image sensitive to the functional information of the body to be examined. On the other hand, in the second half of the imaging sequence of FIG. 4, the NMR signals are detected in either a state before the phases of the nuclear spins are disturbed, or a state in which the phases of the nuclear spins are re-aligned, so that the $T_2$ image obtained by the second data acquisition is the image which is hardly affected by the microscopic magnetic field inhomogeneity and therefore it can serve as the image sensitive to the shape information of the body to be examined.

Now, by using these $T_2$ and $T_2^*$ images obtained by the single continuous imaging sequence of FIG. 4, the image of the physiological function information can be obtained as follows. Namely, when the phase distributions in these $T_2$ and $T_2^*$ images are $I_2 r(x, y)$ and $I_2^* r(x, y)$, the phase difference image $\phi(x, y)$ is given by the following equation (1).

$$\Phi(x,y)=\tan^{-1}(IM[I_2 r(x,y)]/RE[I_2 r(x,y)])-\tan^{-1}(IM[I_2^* r(x,y)]/RE[I_2^* r(x,y)]) \quad (1)$$

Then, from this phase difference image $\Phi(x, y)$, the static magnetic field distribution $\Delta H(x, y)$ can be calculated by the following equation (2).

$$\Delta H(x,y)=\Phi(x,y)/(\gamma \cdot \Delta TE) \quad (2)$$

where $\gamma$ is a gyromagnetic ratio of the target nuclear spins.

This static magnetic field distribution $\Delta H(x, y)$ provides the image indicative of the microscopic magnetic field inhomogeneity within the imaged slice region, and this can reflect the local magnetic field disturbance caused by the paramagnetic deoxyhemoglobin in blood for example. Consequently, by executing the above imaging sequence to take the $T_2$ and $T_2^*$ images together in at least one of the states before, while, or after the body to be examined is stimulated by a stimulation which causes the physiological function change, it becomes possible to obtain the above static magnetic field distribution reflecting the local magnetic field disturbances caused by the physical property of the interior of the body to be examined such as the oxyhemoglobin content in blood.

Furthermore, by executing the above imaging sequence to take the $T_2$ and $T_2^*$ images together in at least two of the states before, while, or after the body to be examined is stimulated by a stimulation which causes the physiological Function change, it becomes possible to derive the change in the static magnetic Field distributions obtained from two states, and this can provide the living body information such as the change of the blood flow or the change of the oxygen density in blood due to the change of the physiological function such as the cell activity within the living body tissues.

Therefore, this first embodiment can provide a scheme for nuclear magnetic resonance imaging of living body information such as the blood flow change or the oxygen density in blood related to the physiological function change in the living body.

Now, using the above imaging sequence of FIG. 4, it is possible to take images of the head portion in two states of with and without stimulation such as the light or sound stimulation given by the stimulation device 17, for example. In such a case, in the $T_2^*$ images obtained by the first data acquisition with and without stimulation, the change occurs in the oxygen density in blood or the local blood flow due to the activation of the particular portion of the brain cells in reaction to the stimulation, so that the $T_2^*$ contrast changes in accordance to the change of the magnetic susceptibility of the local tissues in a vicinity of the activated portion. On the other hand, in the $T_2$ images obtained by the second data acquisition with and without stimulation, the transverse relaxation time $T_2$ of the tissues remains unchanged regardless of the presence or absence of the stimulation, so that the same $T_2$ contrast is obtained in both of the $T_2$ images with and without stimulation.

Then, the portion in which the brain cells have been activated by the stimulation can be detected by the operation according to the flow chart of FIG. 5 as follows.

Namely, from the acquired image data at the initial step 50, the correction processing concerning the static magnetic field inhomogeneity (step 51), the geometrical correction processing concerning the body movement of the living body (step 52), and the correction processing concerning the signal strength among images (step 53) are sequentially and repeatedly carried out until the desired processed images are obtained (step 54). Then, after the desired processed images are obtained, the changed portion in which the brain cells have been activated by the stimulation is detected from the change in the processed $T_2^*$ images with and without stimulation. Finally, the information on the detected portion with the activated brain cells can be presented in a form of the image display (step 56).

Figure 5:
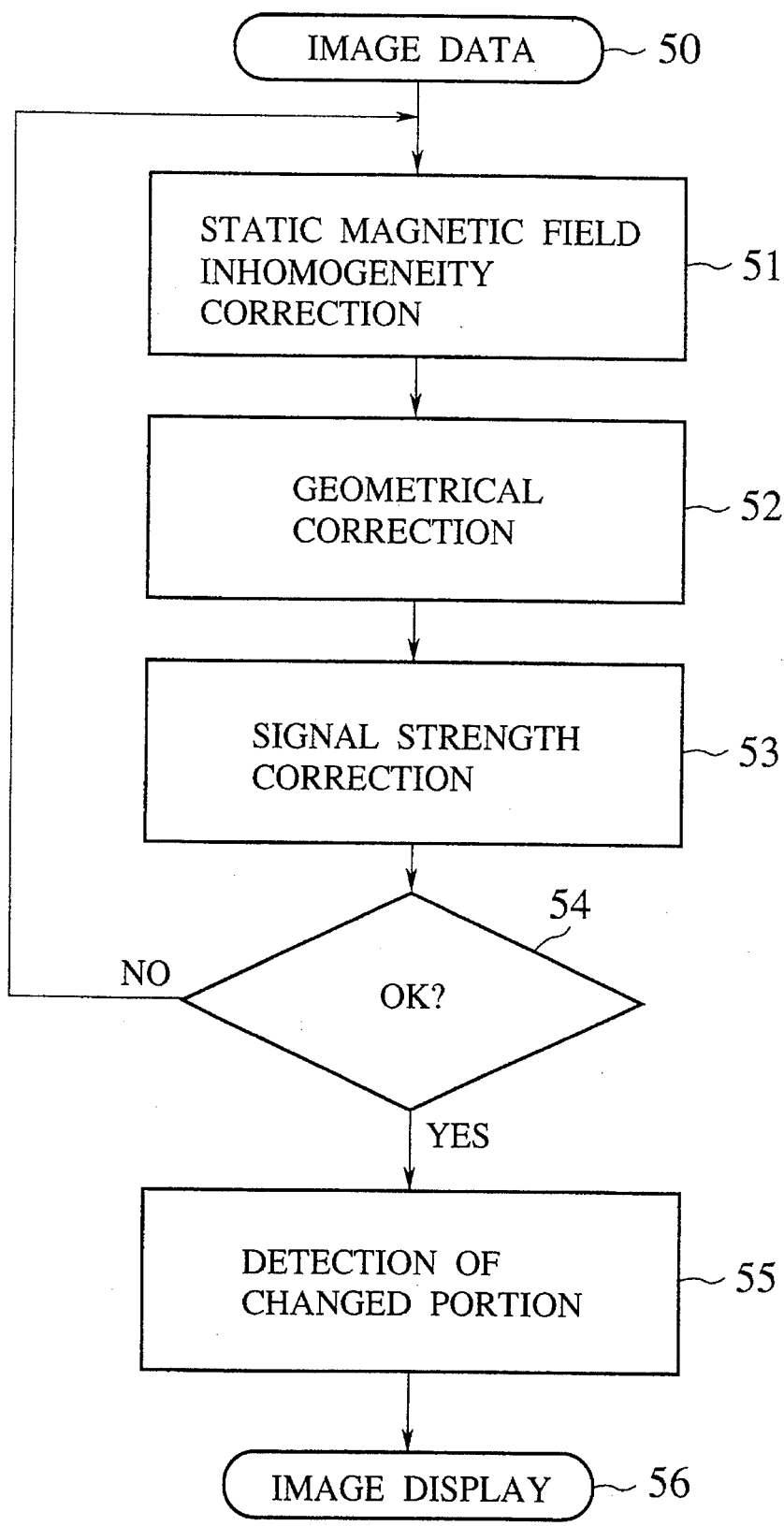
FIG. 5 is a flow chart for the operation to detect the changed portion by using the imaging scheme of FIG. 4 with and without stimulation.
Figure 6:
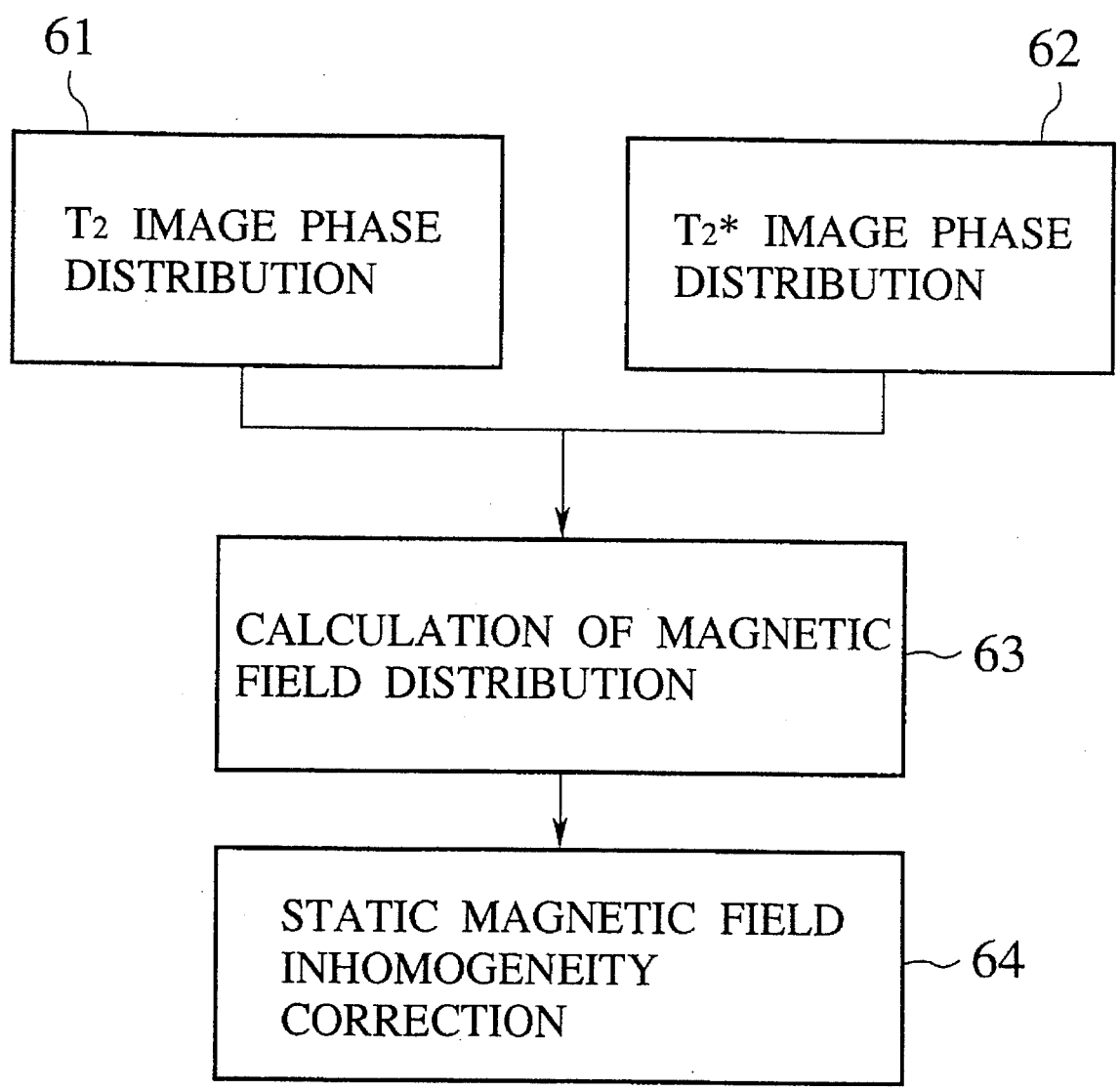
FIG. 6 is a flow chart for the static magnetic field inhomogeneity correction processing used in the operation of FIG. 5.

In further detail, the static magnetic field inhomogeneity correction processing at the step 52 of FIG. 5 can be carried out according to the flow chart of FIG. 6. Namely, from the phase distributions of the $T_2$ and $T_2^*$ images obtained without stimulation at steps 61 and 62, the static magnetic field distribution $\Delta H$ can be calculated by using the equations (1) and (2) described above (step 63), and then the correction of the image distortion caused by the static magnetic field inhomogeneity can be carried out according to the calculated static magnetic field distribution, by using the known correction method such as that disclosed in Japanese Patent Application Laid Open No. 64-56042.

Figure 7:
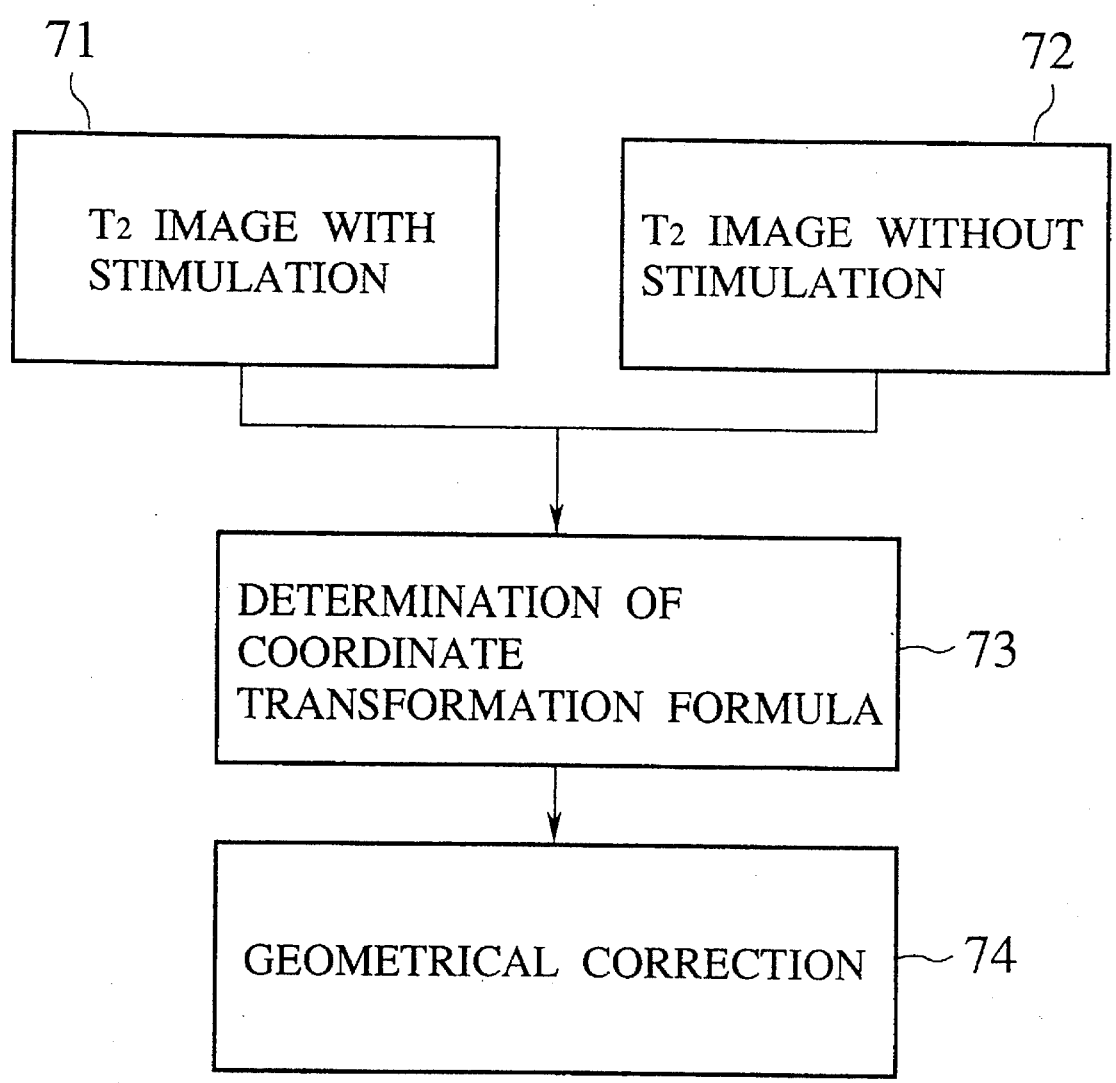
FIG. 7 is a flow chart for the geometrical correction processing used in the operation of FIG. 5.

Next, the geometrical correction processing at the step 52 off FIG. 5 can be carried out according to the flow chart off FIG. 7. Namely, from the $T_2$ images obtained with and without stimulation at steps 71 and 72, the coordinate transformation formula for transforming the coordinates in these $T_2$ images one another can be determined (step 73), and then the geometrical correction of the images according to the determined coordinate transformation formula can be carried out (step 74). Here, the coordinate transformation formula can be given by the affine transformation defined by the following equation (3).

$$\begin{pmatrix} x' \\ y' \end{pmatrix} = \begin{pmatrix} a & b \\ d & e \end{pmatrix} \begin{pmatrix} x \\ y \end{pmatrix} + \begin{pmatrix} c \\ f \end{pmatrix} \quad (3)$$

In this affine transformation of the equation (3), the coefficients a, b, c, d, e, and f can be determined by using the $T_2$ images obtained with and without stimulation or the processed $T_2$ images resulting from the above described static magnetic field inhomogeneity correction processing which indicate the presence and absence of the stimulation. Namely, when the pixel values in these $T_2$ images with and without stimulation are $I_2sc(x, y)$ and $I_2rc(x, y)$, the above coefficients are determined such that the value defined by the following expression (4) becomes minimum.

$$\sum_{x,y=1}^{M,N} (I_2sc(x,y) - I_2rc(X,Y))^2 \quad (4)$$

where M and N are numbers of image pixels in x and y directions.

For this geometrical correction processing, it is also possible to use the other known methods such as those using the Helmert transformation or the quasi-affine transformation, or the method in which the contour extraction is carried out from the $T_2$ images with and without stimulation, and the coordinate transformation Formula is derived from the pattern matching of the extracted contours.

Next, the signal strength correction processing at the step 53 off FIG. 5 can be carried out according to the flow chart of FIG. 8. Namely, from the $T_2$ images obtained with and without the stimulation at steps 81 and 82, the signal strength correction values are calculated (step 83), and the signal strength correction using the calculated signal strength correction values can be carried out (step 84).

Here, as the method for calculating the signal strength correction values, the signal correction magnification rate for the signal strength at each picture element or over an entire image can be obtained from the $T_2$ images with and without stimulation or the processed $T_2$ images.

It is to be noted that all or only a part of the above described correction processings of the steps 51, 52, and 53 of FIG. 5 can be carried out according to the need, and their orders may be changed if desired.

Next, the judgement as to whether the desired processed images are obtained or not at the step 54 of FIG. 5 can be made as follows. Namely, when the pixel values in the processed $T_2$ images with and without stimulation are $I_2sc(x, y)$ and $I_2rc(x, y)$, the judgement can be made by determining whether the value defined by the following expression (5) becomes less than or equal to the desired value.

$$\sum_{x,y=1}^{M,N} (I_2sc(x,y) - A \cdot I_2rc(X,Y))^2 \quad (5)$$

where M and N are numbers of image pixels in x and y directions, and A is the signal correction magnification rate which is either a constant or a function of x and y.

Next, the detection of the changed portion at the step 55 of FIG. 5 can be carried out as follows. Namely, when the pixel values in the processed $T_2^*$ images with and without stimulation are $I_2sc(x, y)$ and $I_2rc(x, y)$, the changed portion can be detected by the thresholding the difference image defined by the following equation (6).

$$Idif(x,y) = I_2 \cdot sc(x,y) - I_2 \cdot rc(x,y) \quad (6)$$

For this detection of the changed portion, it is also possible the use the statistical data processing methods such as the X test method.

Figure 9:
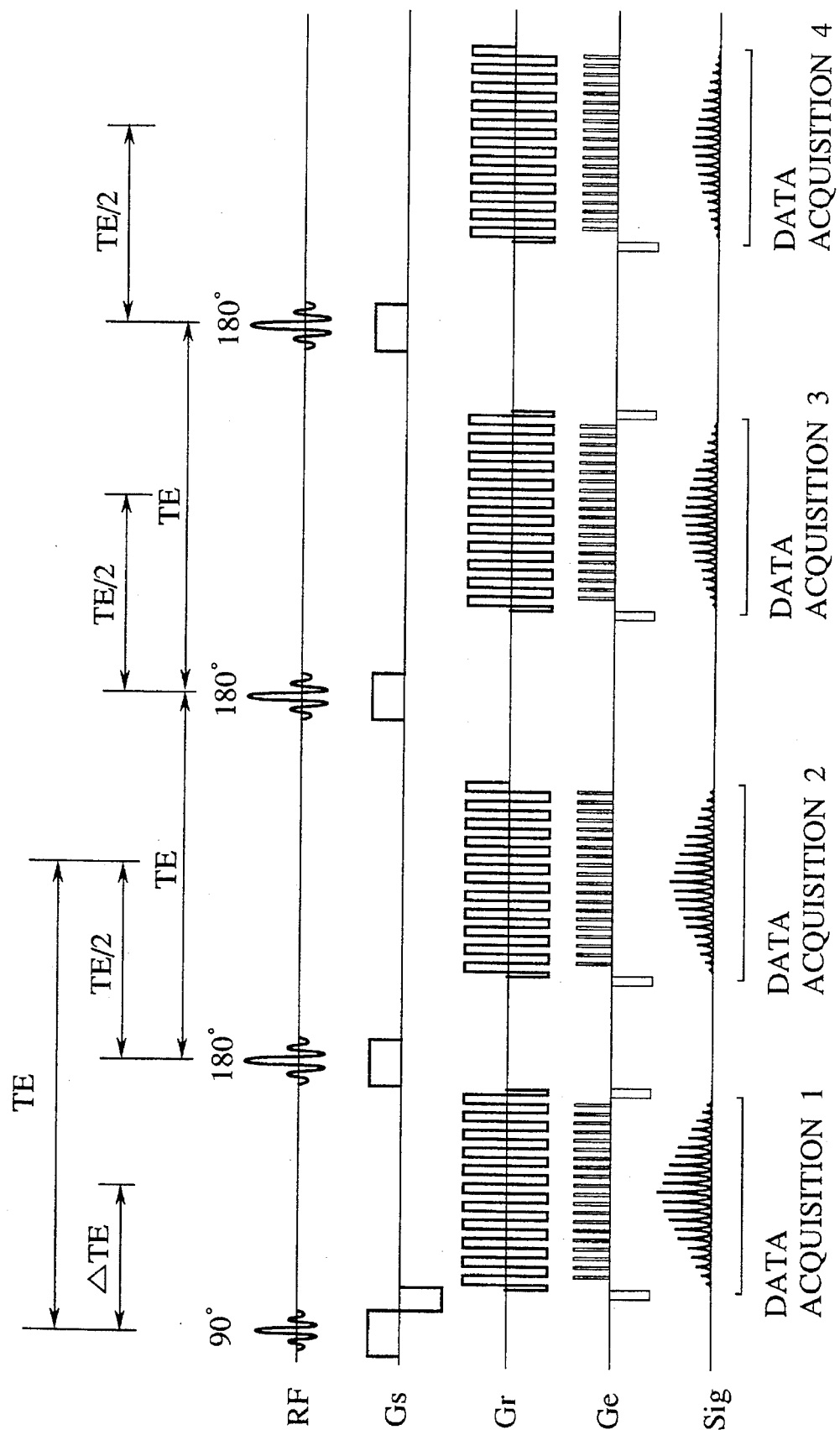
FIG. 9 is a diagram of a pulse sequence for the second embodiment of the imaging scheme for imaging the physiological function information according to the present invention.

Next, FIG. 9 shows the pulse sequence of the second embodiment of the imaging scheme for imaging the physiological function information in the body to be examined.

In this second embodiment, the 90° RF pulse and the slicing gradient magnetic field Gs are applied to excite the desired slice region to generate the free induction decay (FID) NMR signals first. Then, the first data acquisition is carried out by the echo planar scheme in which the reading gradient magnetic field Gr is repeatedly switched to positive and negative alternately to generate a plurality of echo signals, while the phase encoding gradient magnetic field Ge is applied at a timing of each echo signal. Then, the 180° RF pulse is applied to generate the spin echo signals, and the second data acquisition is carried out by the similar echo planar scheme. Thereafter, the similar application of the 180° RF pulse and the gradient magnetic fields are repeated as many times as necessary (four times in FIG. 9) to make the further data acquisitions.

Then, after the appropriate preliminary processing, the data obtained by the data acquisitions are complex Fourier transformed to produce a plurality of images. In these images, the image obtained from the first data acquisition is going to be the $T_2^*$ image reflecting the transverse relaxation time $T_2$ of the nuclear spins and the microscopic magnetic Field inhomogeneity within a voxel as in the first embodiment, while the images obtained from the second and subsequent data acquisitions are going to be the $T_2$ images reflecting the transverse relaxation time $T_2$ of the nuclear spins. Here, however, the echo time (that is, the time interval from the center of the 90° RF pulse to the data at an origin of two dimensionally arranged data For each data acquisition) is different for different data acquisition, so that the images obtained from the second and subsequent data acquisitions are going to be in contrast emphasizing the different $T_2$ values.

Then, similarly as in the first embodiment described above, using the above imaging sequence of FIG. 9, it is possible to take images of the head portion in two states of with and without stimulation such as the light or sound stimulation given by the stimulation device 17, for example. In such a case, in the $T_2^*$ images obtained by the first data acquisition with and without stimulation, the change occurs in the oxygen density in blood or the local blood flow due to the activation of the particular portion of the brain cells in reaction to the stimulation, so that the $T_2^*$ contrast changes in accordance to the change of the magnetic susceptibility of the local tissues in a vicinity of the activated portion. On the other hand, in the $T_2$ images obtained by the second and subsequent data acquisitions with and without stimulation, the transverse relaxation time $T_2$ of the tissues remains unchanged regardless of the presence or absence of the stimulation, so that the same $T_2$ contrast is obtained in both of the $T_2$ images with and without stimulation.

Then, the portion in which the brain cells have been activated by the stimulation can be detected quantitatively by the operation according to the flow chart of FIG. 10 as follows.

Namely, as in the case of FIG. 5 for the first embodiment described above, from the acquired image data at the initial step 50, the correction processing concerning the static magnetic field inhomogeneity (step 51), the geometrical correction processing concerning the body movement of the living body (step 52), and the correction processing concerning the signal strength among images (step 53) are sequentially and repeatedly carried out until the desired processed images are obtained (step 54). Then, after the desired processed images are obtained, the the $T_2$ normalization processing for calculating the $T_2$ value distribution and normalizing the signal strength according to the calculated $T_2$ value distribution is carried out (step 101) in order to enable the quantitative detection of the changed portion.

Figure 11:
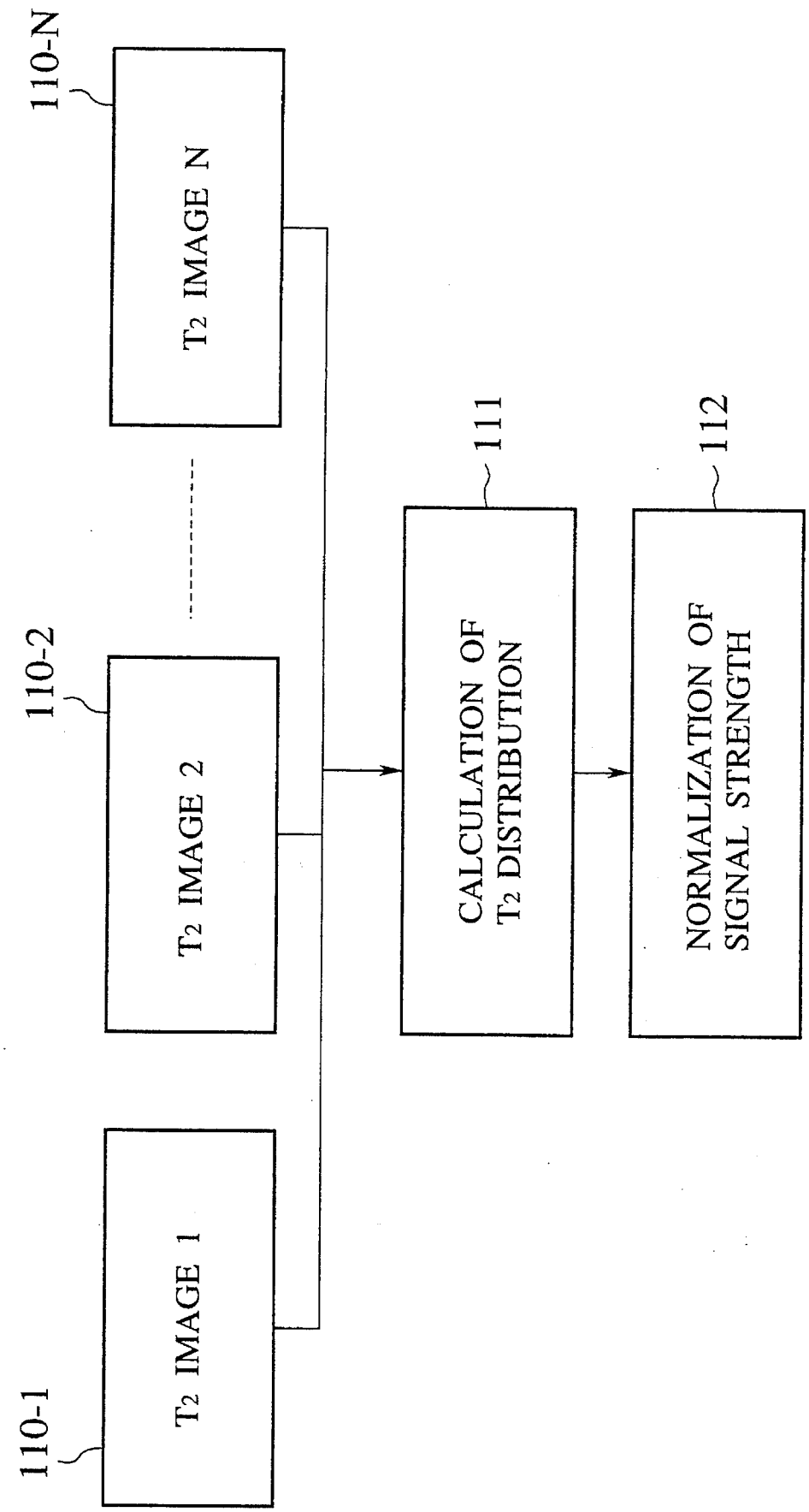
FIG. 11 is a flow chart for the $T_2$ normalization processing used in the operation of FIG. 10.

This $T_2$ normalization processing at the step 101 of FIG. 9 can be carried out according to the flow chart of FIG. 11. Namely, from a plurality of $T_2$ images obtained by the second and subsequent data acquisitions at the steps 110-1 to 110-N, the $T_2$ value at each picture element is calculated according to the change of the signal strength of the corresponding image data among these $T_2$ images to obtain the $T_2$ value distribution (step 111). Then, according to this obtained $T_2$ value distribution, the normalization of the signal strength in the $T_2^*$ images obtained by the first data acquisition is carried out (step 112).

Next, the changed portion in which the brain cells have been activated by the stimulation is quantified by calculating the change of the signal strength in the processed $T_2^*$ images with and without stimulation (step 102). In this manner, it becomes possible to quantitatively detects the change of the local blood flow or the oxygen density in blood due to the activation of the brain cells as the change of the magnetic susceptibility of the local tissues, regardless of the $T_2$ value of the tissues.

Figure 10:
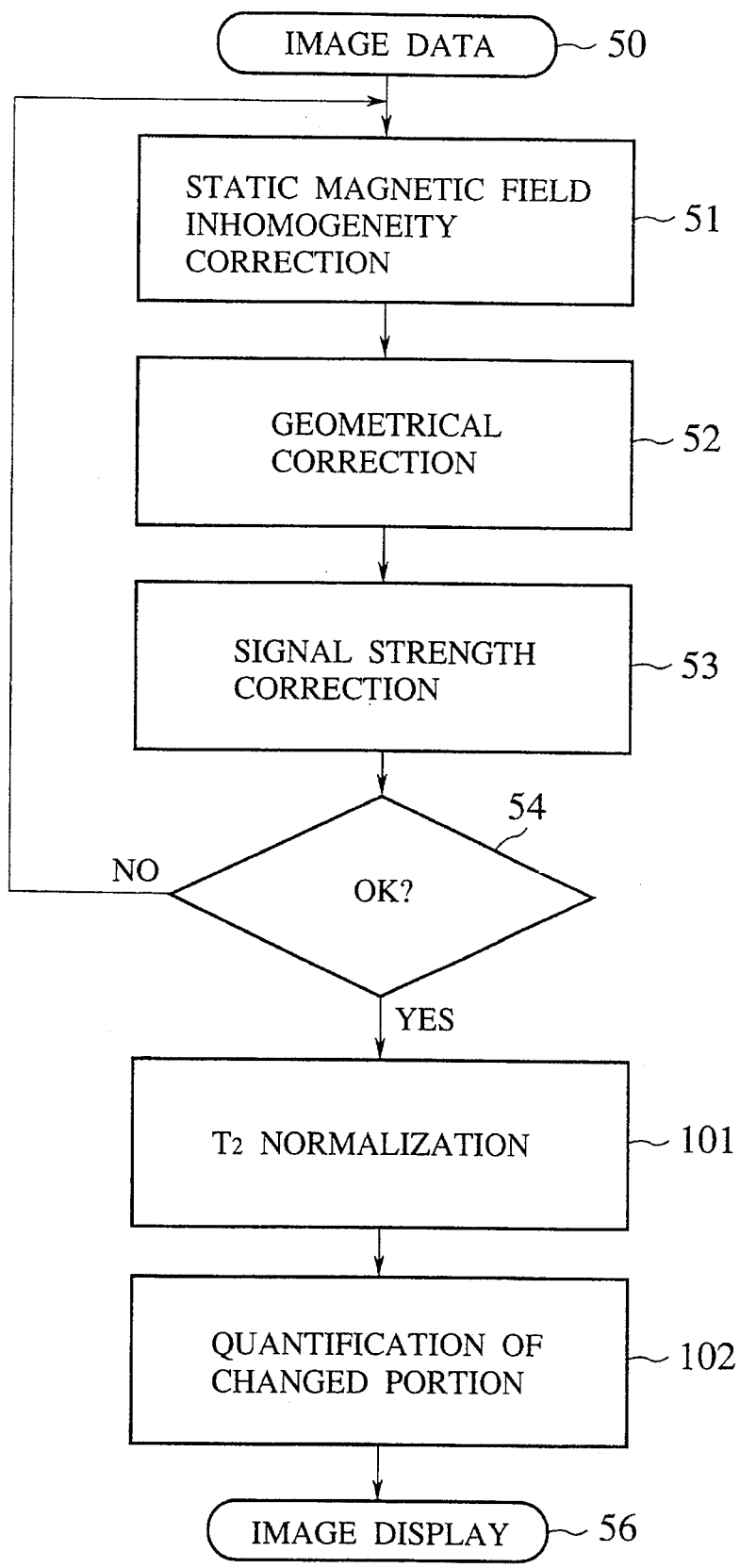
FIG. 10 is a flow chart for the operation to quantitatively detect the changed portion by using the imaging scheme of FIG. 9 with and without stimulation.
Figure 12:
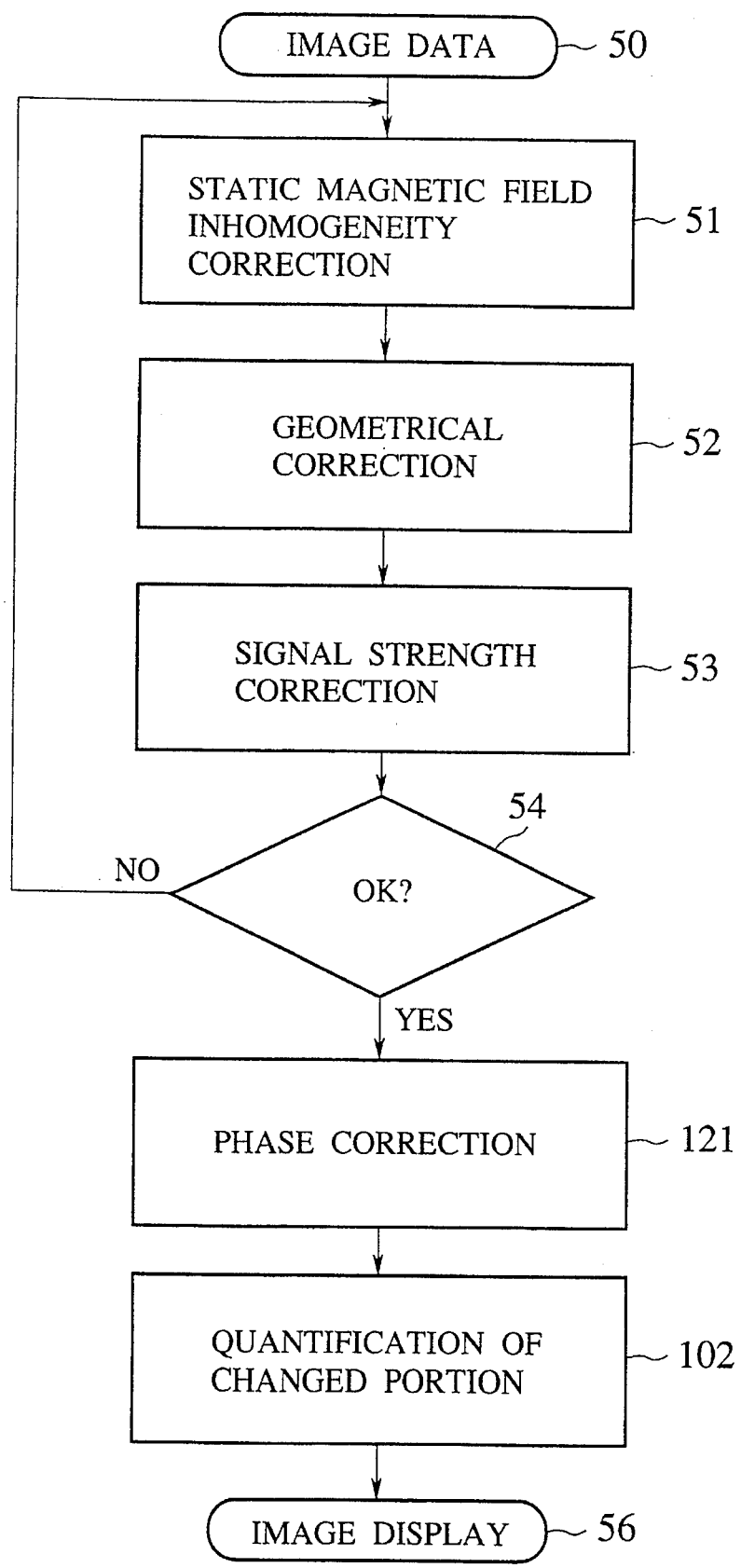
FIG. 12 is a flow chart for the operation to quantitatively detect the changed portion by using the imaging scheme of FIG. 9 with and without stimulation and the phase correction processing.

Similarly, instead of quantifying the function information from the change of the signal strength as in FIG. 10, it is also possible to quantify the function information from the change of the phase information in the images as shown in FIG. 12. In this case, instead of the $T_2$ normalization processing at the step 101 in FIG. 10, the phase correction processing concerning the phase error due to the static magnetic field inhomogeneity must be carried out (step 121) before the quantification of the changed portion at the step 102. Here, however, this phase correction processing can be carried out by utilizing the static magnetic field distribution information obtained in the static magnetic field inhomogeneity correction processing described above.

Figure 13:
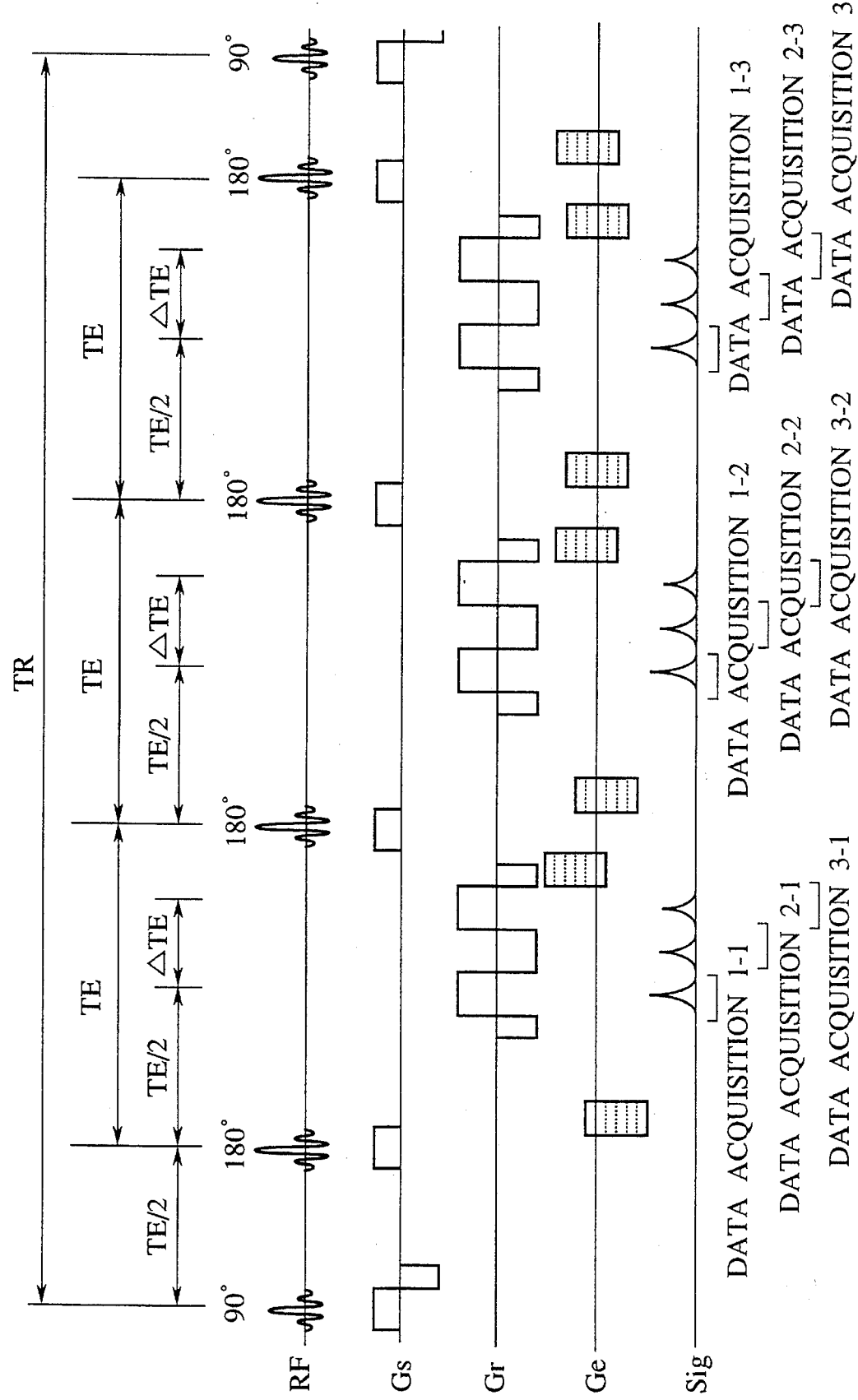
FIG. 13 is a diagram of a pulse sequence for the third embodiment of the imaging scheme for imaging the physiological function information according to the present invention.

Next, FIG. 13 shows the pulse sequence of the third embodiment of the imaging scheme for imaging the physiological function information in the body to be examined.

In this third embodiment, instead of the echo planar scheme used in the first and second embodiments described above, the high speed spin echo scheme for generating a plurality of echo signals by the repeated application of the 180° RF pulses is used. Thus, in this case, the 90° RF pulse and the slicing gradient magnetic field Gs are applied to excite the desired slice region to generate the free induction decay (FID) NMR signals first. Then, the 180° RF pulses and the slicing gradient magnetic field Gs are repeatedly applied while between the successive applications of the 180° RF pulse and the slicing gradient magnetic field Gs, the reading gradient magnetic field Gr is repeatedly switched to positive and negative alternately to generate a plurality of echo signals, and the phase encoding gradient magnetic Field Ge is applied before and at the end of the reading gradient magnetic field Gr at sequentially shifted levels as indicated in FIG. 13 according to the high speed spin echo scheme.

Then, the data acquisition is carried out every time the reading gradient magnetic field Gr is switched, and this pulse sequence is repeated For as many times as necessary at the repetition time TR, such that the $T_2$ images can be obtained From the data acquired by the data acquisitions 1-1, 1-2, 1-3, etc., while the $T_2^*$ images can be obtained from the data acquired by the data acquisitions 2-1, 2-2, 2-8, etc. and the acquisitions 3-1, 3-2, etc. Then, the image processing similar to that in the first and second embodiment described above can be applied to the obtained $T_2$ and $T_2^*$ images.

Figure 14:
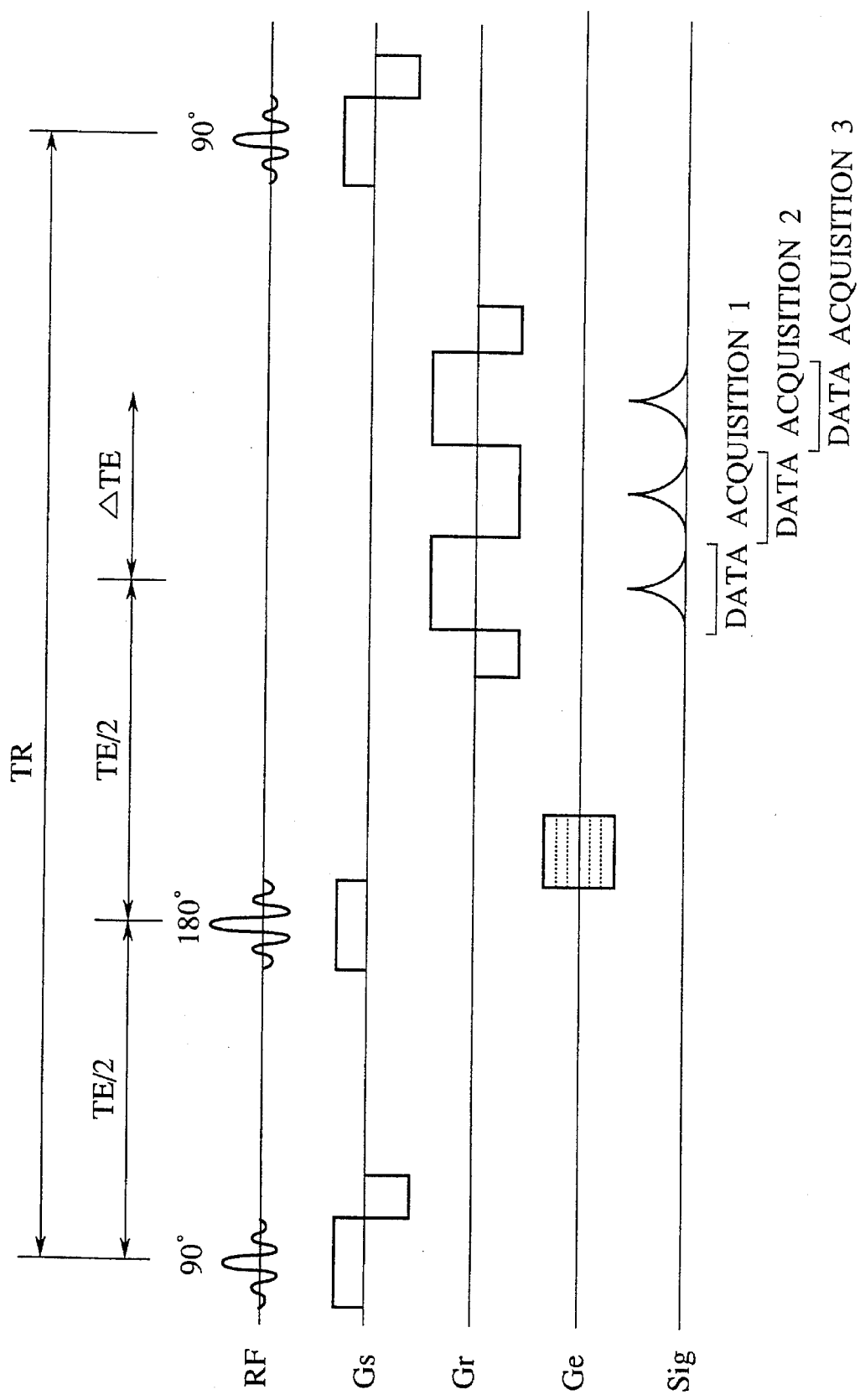
FIG. 14 is a diagram of a pulse sequence for the fourth embodiment of the imaging scheme for imaging the physiological function information according to the present invention.

Next, FIG. 14 shows the pulse sequence of the fourth embodiment of the imaging scheme for imaging the physiological function information in the body to be examined.

In this fourth embodiment, instead of the echo planar scheme used in the first and second embodiments described above, the spin echo scheme is used. Thus, in this case, the 90° RF pulse and the slicing gradient magnetic field Gs are applied to excite the desired slice region to generate the free induction decay (FID) NMR signals first. Then, the 180° RF pulses and the slicing gradient magnetic field Gs are applied, and the reading gradient magnetic field Gr is repeatedly switched to positive and negative alternately to generate a plurality of echo signals, while the phase encoding gradient magnetic field Ge is applied before the reading gradient magnetic field Gr at sequentially as indicated in FIG. 14 according to the spin echo scheme.

Then, the data acquisition is carried out every time the reading gradient magnetic field Gr is switched, and this pulse sequence is repeated for as many times as necessary at the repetition time TR, such that the $T_2$ images can be obtained from the data acquired by the data acquisitions 1, while the $T_2^*$ images can be obtained from the data acquired by the data acquisitions 2, and 3.

Figure 15:
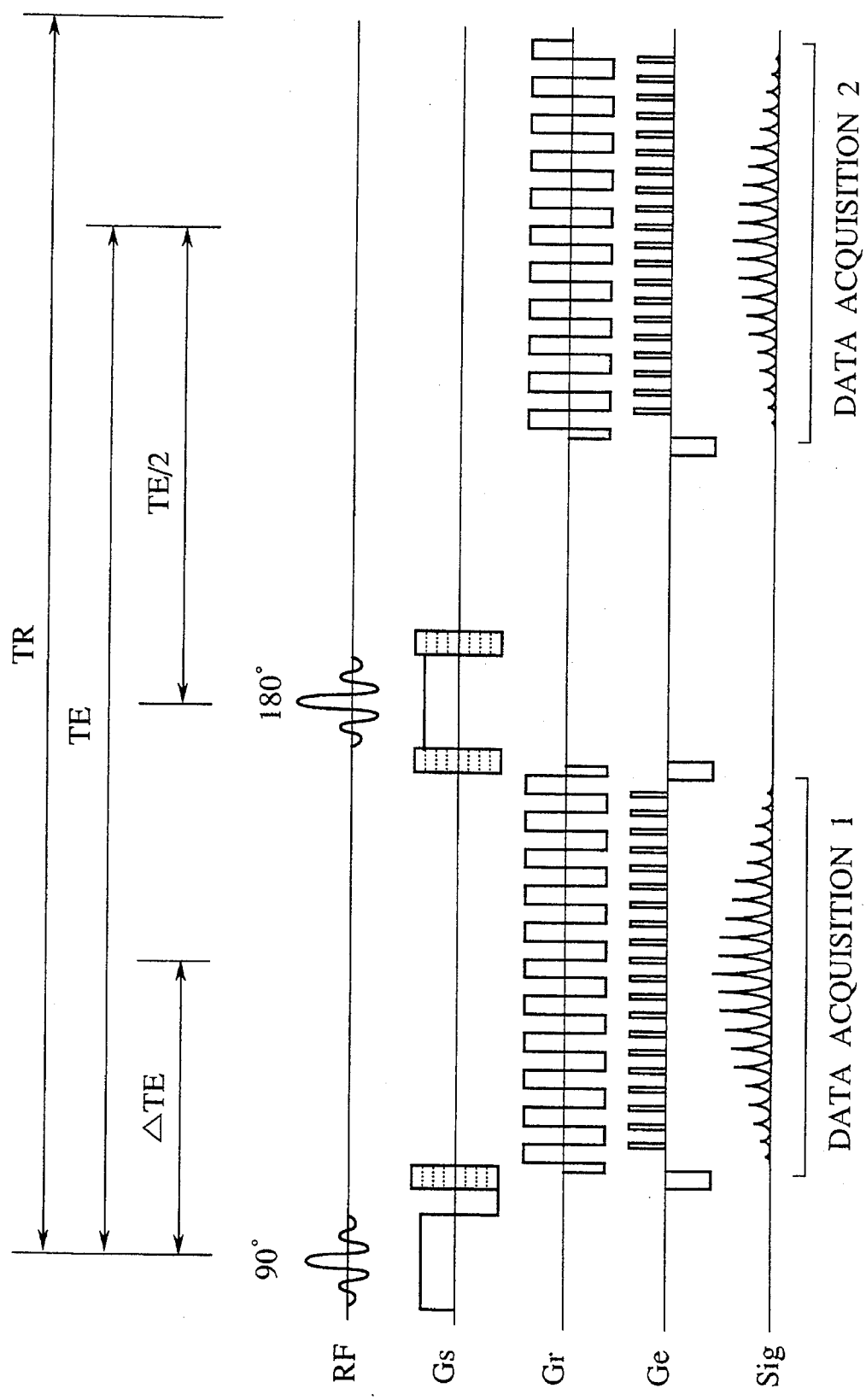
FIG. 15 is a diagram of a pulse sequence for the fifth embodiment of the imaging scheme for imaging the physiological function information according to the present invention.
Figure 16:
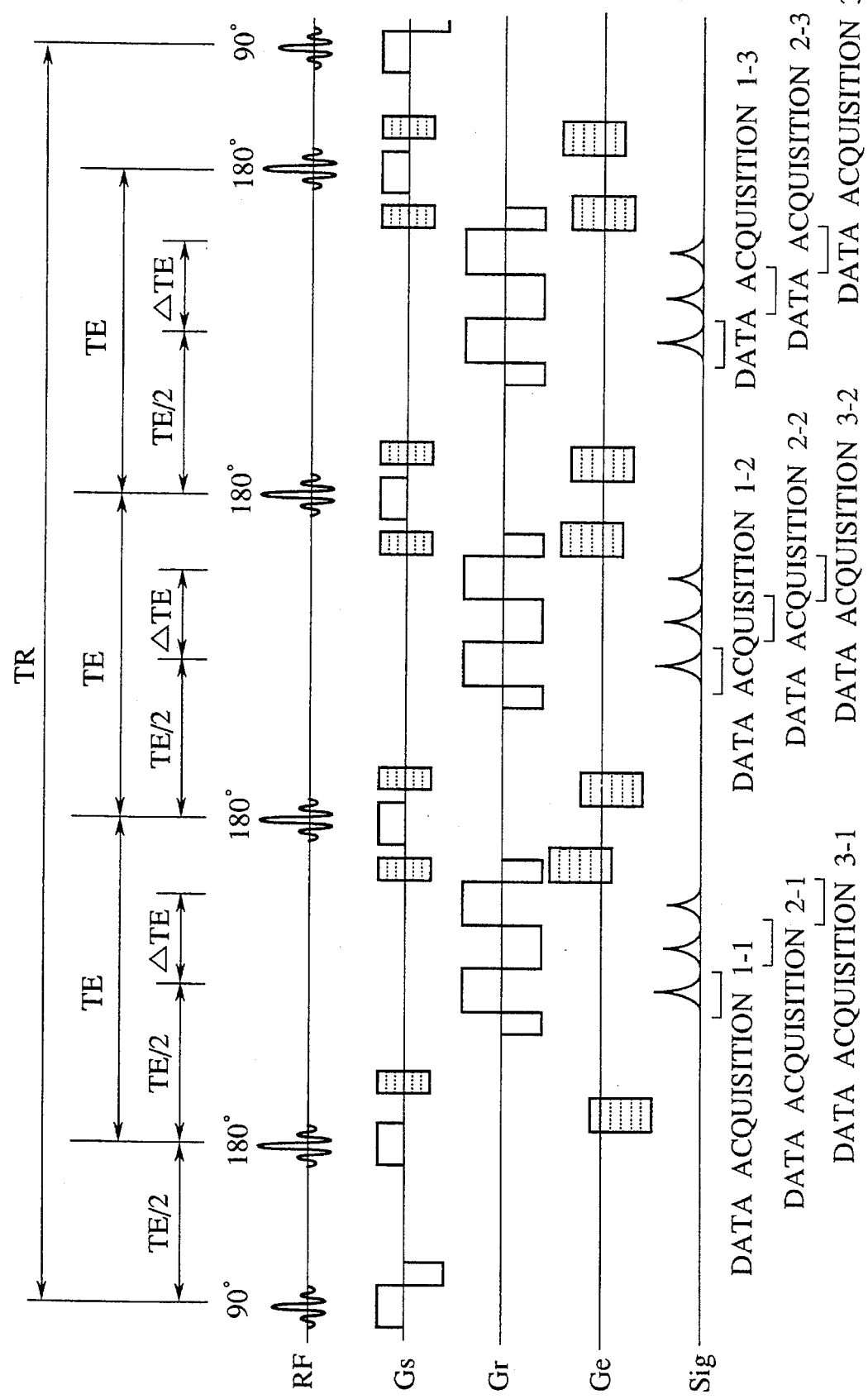
FIG. 16 is a diagram of a pulse sequence for the sixth embodiment of the imaging scheme for imaging the physiological function information according to the present invention.

Next, FIG. 15 and FIG. 18 show the pulse sequences of the fifth and sixth embodiments of the imaging scheme for imaging the physiological function information in the body to be examined.

In these fifth and sixth embodiments, the first and third embodiments of FIG. 4 and FIG. 18 described above are adapted to the three dimensional imaging scheme. In either one or these two cases, the phase encoding is also made by the slicing gradient magnetic field Gs and the pulse sequence is repeatedly executed to obtain the three dimensional data. For these three dimensional data, the image processing similar to that described above can be expanded into three dimensions in an obvious manner.

It is also possible to apply the imaging scheme for imaging the physiological function information in the body to be examined according to the present invention to the other known pulse sequence such as that of the gradient echo scheme.

In a case there is a directionality in the body movements of the body to be examined, it is possible to set up the imaging direction such that the influence due to the body movements can be suppressed, and it is also possible to utilize the ECG gated imaging, or the application of the rephasing gradient magnetic Field pulses for suppressing the influence of the body movements, or the scheme for suppressing the signals from the cerebrospinal fluid in a case of imaging the head portion.

As described, according to the present invention, it is possible to realize the nuclear magnetic resonance imaging of the living body information such as the blood flow change or the oxygen density in blood related to the physiological function change in the living body, quantitatively, at high precision, without being influenced by the body movements of the body to be examined, the transverse relaxation time of the target nuclear spins, the static magnetic field inhomogeneity, and the image signal strength change, so that the living body information highly useful in the investigation of the living body function and the diagnosis of diseases can be obtained non-invasively.

It is to be noted here that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. A method of nuclear magnetic resonance imaging, comprising the steps of:

imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signal to construct nuclear magnetic resonance images;

controlling the pulse sequence to realize a first imaging scheme sensitive to a functional property of the body to be examined, for obtaining first type nuclear magnetic resonance images which are easily affected by a microscopic magnetic field inhomogeneity, and a second imaging scheme insensitive to the functional property of the body to be examined, for obtaining second type nuclear magnetic resonance images which are hardly affected by the microscopic magnetic field inhomogeneity, so as to obtain the first and second types of the nuclear magnetic resonance images corresponding to the first and second imaging schemes, respectively, by a single execution of the imaging step; and obtaining functional information of the body to be examined by processing the first and second types of the nuclear magnetic resonance images.

2. The method of claim 1, wherein the first imaging scheme is an imaging scheme in which the nuclear magnetic resonance signals are detected in a state in which phases of target nuclear spins are disturbed by a microscopic magnetic field inhomogeneity, while the second imaging scheme is an imaging scheme in which the nuclear magnetic resonance signals are detected in a state in which the phases of the target nuclear spins are not disturbed.

3. The method of claim 2, wherein at the controlling step, the pulse sequence is controlled such that the second imaging scheme is carried out before the phases of the target nuclear spins are disturbed by a microscopic magnetic field inhomogeneity.

4. The method of claim 2, wherein at the controlling step, the pulse sequence is controlled such that the second imaging scheme is carried out after the phases of the target nuclear spins are re-aligned.

5. The method of claim 1, wherein the first type nuclear magnetic resonance images are $T_2^*$ images while the second type nuclear magnetic resonance images are $T_2$ images.

6. The method of claim 1, wherein at the obtaining step, the functional information indicates a living body information related to a physiological function of the body to be examined.

7. The method of claim 1, wherein at the obtaining step, the functional information indicates a change of at least one of an oxygen density in blood and a local blood flow in the body to be examined.

8. The method of claim 1, wherein at the controlling step, the pulse sequence is controlled to be carried out in at least one of states before, while, and after a stimulation is given to the body to be examined.

9. The method of claim 1, further comprising steps of:

calculating image correction values concerning a static magnetic field inhomogeneity correction according to the first and second types of the nuclear magnetic resonance images; and correcting the first and second types of the nuclear magnetic resonance images by the image correction values;

wherein at the obtaining steps, the functional information is obtained by processing the first and second types of the nuclear magnetic resonance images corrected at the correcting step.

10. The method of claim 1, wherein at the controlling step, the pulse sequence is controlled to be carried out at least twice, with and without a stimulation given to the body to be examined, and at the obtaining step, the functional information is obtained from the first type nuclear magnetic resonance images corresponding to the first imaging scheme carried out with and without the stimulation.

11. The method of claim 10, further comprising steps of:

calculating image correction values concerning at least one of a geometrical correction and a signal strength correction from the second type nuclear magnetic resonance images corresponding to the second imaging scheme carried out with and without the stimulation; and correcting the first and second types of the nuclear magnetic resonance images by the image correction values;

wherein at the obtaining steps, the functional information is obtained by processing the first and second types of the nuclear magnetic resonance images corrected at the correcting step.

12. The method of claim 10, wherein the obtaining step further includes the steps of:

normalizing the first type nuclear magnetic resonance images according to a picture element value distribution in the second type nuclear magnetic resonance images; and quantifying a change of the functional information of the body to be examined from the first type nuclear magnetic resonance images corresponding to the first imaging scheme carried out with and without the stimulation, which are normalized at the normalizing step.

13. The method of claim 10, wherein the obtaining step further includes the steps of:

correcting the first type nuclear magnetic resonance images by a phase correction concerning a homogeneity of the static magnetic field; and quantifying a change of the functional information of the body to be examined from the first type nuclear magnetic resonance images corresponding to the first imaging scheme carried out with and without the stimulation, which are corrected at the correcting step.

14. The method of claim 1, wherein at the imaging step, the pulse sequence for the first imaging scheme includes:

an application of a 90° RF pulse and a slicing gradient magnetic field to excite a desired slice region to generate free induction decay nuclear magnetic resonance signals; and an execution of a first data acquisition by applying a reading gradient magnetic field which is repeatedly switched to positive and negative alternately to generate a plurality of echo signals, while applying a phase encoding gradient magnetic field at a timing of each echo signal;

while the pulse sequence for the second imaging scheme includes:

an application of a 180° RF pulse to generate the spin echo signals; and an execution of a second data acquisition by applying the reading gradient magnetic field which is repeatedly switched to positive and negative alternately to generate a plurality of echo signals, while applying the phase encoding gradient magnetic field at a timing of each echo signal.

15. The method of claim 1, wherein at the imaging step, the pulse sequence for the first imaging scheme includes:

an application of a 90° RF pulse and a slicing gradient magnetic field to excite a desired slice region to generate free induction decay nuclear magnetic resonance signals; and an execution of a First data acquisition by applying a reading gradient magnetic field which is repeatedly switched to positive and negative alternately to generate a plurality of echo signals, while applying a phase encoding gradient magnetic field at a timing of each echo signal;

while the pulse sequence of the second imaging scheme includes:

an application of a 180° RF pulse to generate the spin echo signals;

and execution of a second data acquisition by applying the reading gradient magnetic field which is repeatedly switched to positive and negative alternately to generate a plurality of echo signals, while applying the phase encoding gradient magnetic field at a timing of each echo signal; and an execution of subsequent data acquisitions by repeating an application of the 180° RF pulse and an application of the reading gradient magnetic field and the phase encoding gradient magnetic field.

16. The method of claim 1, wherein the pulse sequence for the first and second imaging schemes includes:

an application of a 90° RF pulse and a slicing gradient magnetic field to excite a desired slice region to generate free induction decay nuclear magnetic resonance signals; and an execution of a plurality of data acquisitions by repeatedly applying a 180° RF pulses and the slicing gradient magnetic field, while applying a reading gradient magnetic field which is repeatedly switched to positive and negative alternately to generate a plurality of echo signals and a phase encoding gradient magnetic field before and at an end of the reading gradient magnetic field at sequentially shifted levels during a period between successive applications of the 180° RF pulse and the slicing gradient magnetic field.

17. The method of claim 1, wherein the pulse sequence for the first and second imaging schemes includes:

an application of a 90° RF pulse and a slicing gradient magnetic field to excite a desired slice region to generate free induction decay nuclear magnetic resonance signals; and an execution of a plurality of data acquisitions by applying a 180° RF pulses and the slicing gradient magnetic field, while applying a reading gradient magnetic field which is repeatedly switched to positive and negative alternately to generate a plurality of echo signals and a phase encoding gradient magnetic field before and at an end of the reading gradient magnetic field at sequentially shifted levels.

18. An apparatus for nuclear magnetic resonance imaging, comprising:

imaging means for imaging a body to be examined placed in a homogeneous static magnetic field by applying radio frequency magnetic field and gradient magnetic fields according to a pulse sequence, detecting nuclear magnetic resonance signals emitted from the body to be examined in response to the radio frequency magnetic field and the gradient magnetic fields, and processing the nuclear magnetic resonance signals to construct nuclear magnetic resonance images;

control means for controlling the pulse sequence to realize a first imaging scheme sensitive to a functional property of the body to be examined, for obtaining first type nuclear magnetic resonance images which are easily affected by a microscopic magnetic field inhomogeneity, and a second imaging scheme insensitive to the functional property of the body to be examined, for obtaining second type nuclear magnetic resonance images which are hardly affected by the microscopic magnetic field inhomogeneity, so as to obtain the first and second types of the nuclear magnetic resonance images corresponding to the first and second imaging schemes, respectively, by a single execution of the pulse sequence; and processing means for obtaining functional information of the body to be examined by processing the first and second types of the nuclear magnetic resonance images.

19. The apparatus of claim 18, wherein the first imaging scheme is an imaging scheme in which the nuclear magnetic resonance signals are detected in a state in which phases of target nuclear spins are disturbed by a microscopic magnetic field inhomogeneity, while the second imaging scheme is an imaging scheme in which the nuclear magnetic resonance signals are detected in a state in which the phases of the target nuclear spins are not disturbed.

20. The apparatus of claim 19, wherein the control means controls the pulse sequence such that the second imaging scheme is carried out before the phases of the target nuclear spins are disturbed by the microscopic magnetic field inhomogeneity.

21. The apparatus of claim 19, wherein the control means controls the pulse sequence such that the second imaging scheme is carried out after the phases of the target nuclear spins are re-aligned.

22. The apparatus of claim 18, wherein the first type nuclear magnetic resonance images are $T_2^*$ images while the second type nuclear magnetic resonance images are $T_2$ images.

23. The apparatus of claim 18, wherein the processing means obtains the functional information indicating a living body information related to a physiological function of the body to be examined.

24. The apparatus of claim 18, wherein the processing means obtains the functional information indicating a change of at least one of an oxygen density in blood and a local blood flow in the body to be examined.

25. The apparatus of claim 18, wherein the control means controls the imaging means to carry out the pulse sequence in at least one of states before, while, and after a stimulation is given to the body to be examined.

26. The apparatus of claim 18, further comprising:

means for calculating image correction values concerning a static magnetic field inhomogeneity correction according to the first and second types of the nuclear magnetic resonance images; and means for correcting the first and second types of the nuclear magnetic resonance images by the image correction values;

wherein the processing means obtains the functional information by processing the first and second types of the nuclear magnetic resonance images corrected by the correcting means.

27. The apparatus of claim 18, further comprising stimulation means for giving a stimulation to the body to be examined, and wherein the control means controls the imaging means to carry out the pulse sequence at least twice, with and without a stimulation given to the body to be examined by the stimulation means, and the processing means obtains the functional information by processing the first type nuclear magnetic resonance images corresponding to the first imaging scheme carried out with and without the stimulation.

28. The apparatus of claim 27, further comprising:

means for calculating image correction values concerning at least one of a geometrical correction and a signal strength correction from the second type nuclear magnetic resonance images corresponding to the second imaging scheme carried out with and without the stimulation; and means for correcting the first and second types of the nuclear magnetic resonance images by the image correction values;

wherein the processing means obtains the functional information by processing the first and second types of the nuclear magnetic resonance images corrected by the correcting means.

29. The apparatus of claim 27, wherein the processing means further includes:

means for normalizing the first type nuclear magnetic resonance images according to a picture element value distribution in the second type nuclear magnetic resonance images; and means for quantifying a change of the functional information of the body to be examined from the first type nuclear magnetic resonance images corresponding to the first imaging scheme carried out with and without the stimulation, which are normalized by the normalizing means.

30. The apparatus of claim 27, wherein the processing means further includes:

means for correcting the first type nuclear magnetic resonance images by a phase correction concerning a static magnetic field inhomogeneity; and means for quantifying a change of the functional information of the body to be examined from the first type nuclear magnetic resonance images corresponding to the First imaging scheme carried out with and without the stimulation, which are corrected by the correcting means.

31. The apparatus of claim 18, wherein the imaging means carries out the pulse sequence in which the pulse sequence For the first imaging scheme includes:

an application of a 90° RF pulse and a slicing gradient magnetic field to excite a desired slice region to generate free induction decay nuclear magnetic resonance signals; and an execution of a first data acquisition by applying a reading gradient magnetic field which is repeatedly switched to positive and negative alternately to generate a plurality of echo signals, while applying a phase encoding gradient magnetic field at a timing of each echo signal;

while the pulse sequence for the second imaging scheme includes:

an application of a 180° RF pulse to generate the spin echo signals; and an execution of a second data acquisition by applying the reading gradient magnetic field which is repeatedly switched to positive and negative alternately to generate a plurality of echo signals, while applying the phase encoding gradient magnetic field at a timing of each echo signal.

32. The apparatus of claim 18, wherein the imaging means carried out the pulse sequence in which the pulse sequence for the first imaging scheme includes:

an application of a 90° RF pulse and a slicing gradient magnetic field to excite a desired slice region to generate free induction decay nuclear magnetic resonance signals; and an execution of a first data acquisition by applying a reading gradient magnetic field which is repeatedly switched to positive and negative alternately to generate a plurality of echo signals, while applying a phase encoding gradient magnetic field at a timing of each echo signal;

while the pulse sequence For the second imaging scheme includes:

an application of a 180° RF pulse to generate the spin echo signals;

an execution a second data acquisition by applying the reading gradient magnetic field which is repeatedly switched to positive and negative alternately to generate a plurality of echo signals, while applying the phase encoding gradient magnetic field at a timing of each echo signal; and execution of subsequent data acquisitions by repeating an application of the 180° RF pulse and an application of the reading gradient magnetic field and the phase encoding gradient magnetic field.

33. The apparatus of claim 18, wherein the imaging means carries out the pulse sequence in which the pulse sequence For the first and second imaging schemes includes:

an application of a 90° RF pulse and a slicing gradient magnetic field to excite a desired slice region to generate free induction decay nuclear magnetic resonance signals; and an execution of a plurality of data acquisitions by repeatedly applying a 180° RF pulses and the slicing gradient magnetic field, while applying a reading gradient magnetic field which is repeatedly switched to positive and negative alternately to generate a plurality of echo signals and a phase encoding gradient magnetic field before and at an end of the reading gradient magnetic field at sequentially shifted levels during a period between successive applications of the 180° RF pulse and the slicing gradient magnetic field.

34. The apparatus of claim 18, wherein the imaging means carries out the pulse sequence in which the pulse sequence for the first and second imaging schemes includes:

an application of a 90° RF pulse and a slicing gradient magnetic field to excite a desired slice region to generate free induction decay nuclear magnetic resonance signals; and an execution of a plurality of data acquisitions by applying a 180° RF pulses and the slicing gradient magnetic field, while applying a reading gradient magnetic field, which is repeatedly switched to positive and negative alternately to generate a plurality of echo signals and a phase encoding gradient magnetic field before and at an end of the reading gradient magnetic field at sequentially shifted levels.

* * * * *